United States Patent
New et al.

(10) Patent No.: US 7,876,634 B2
(45) Date of Patent: Jan. 25, 2011

(54) APPARATUS AND METHOD FOR ADJUSTING A SUPPLY VOLTAGE BASED ON A READ RESULT

(75) Inventors: David New, Cambridge (GB); Paul Darren Hoxey, Cambridge (GB); David Michael Bull, Balsham (GB); Shidhartha Das, Ann Arbor, MI (US)

(73) Assignee: ARM Limited, Cambridge (GB)

( * ) Notice: Subject to any disclaimer, the term of this patent is extended or adjusted under 35 U.S.C. 154(b) by 239 days.

(21) Appl. No.: 12/085,901

(22) PCT Filed: Dec. 2, 2005

(86) PCT No.: PCT/GB2005/004636

§ 371 (c)(1),
(2), (4) Date: Jun. 2, 2008

(87) PCT Pub. No.: WO2007/063264

PCT Pub. Date: Jun. 7, 2007

(65) Prior Publication Data

US 2009/0161442 A1 Jun. 25, 2009

(51) Int. Cl.
*G11C 11/00* (2006.01)
(52) U.S. Cl. .................. 365/205; 365/226; 365/200; 365/189.04
(58) Field of Classification Search .......... 365/200, 365/201, 226, 205
See application file for complete search history.

(56) References Cited

U.S. PATENT DOCUMENTS

| | | | |
|---|---|---|---|
| 5,305,275 A * | 4/1994 | Yamashita et al. ..... | 365/185.21 |
| 5,487,045 A | 1/1996 | Trodden | |
| 5,519,712 A * | 5/1996 | Shu et al. ................ | 365/201 |
| 5,615,168 A * | 3/1997 | Lattimore et al. ........ | 365/233.1 |
| 5,901,088 A * | 5/1999 | Kraus ..................... | 365/185.21 |
| 6,373,765 B1 * | 4/2002 | Birk ......................... | 365/207 |
| 6,504,777 B1 * | 1/2003 | Hsu et al. .................. | 365/205 |
| 6,870,770 B2 * | 3/2005 | Roohparvar .......... | 365/185.22 |
| 6,886,119 B2 * | 4/2005 | Vancura ..................... | 714/718 |
| 6,944,607 B1 | 9/2005 | Zhang et al. | |
| 7,212,463 B2 * | 5/2007 | Zeevi et a .................. | 365/226 |
| 7,333,357 B2 * | 2/2008 | Houston .................... | 365/154 |
| 7,548,473 B2 * | 6/2009 | Chen et al. ................. | 365/201 |
| 7,616,509 B2 * | 11/2009 | Qureshi et al. ............. | 365/201 |
| 2001/0017803 A1 | 8/2001 | Ohno | |
| 2006/0220639 A1* | 10/2006 | Hyde ......................... | 324/210 |

FOREIGN PATENT DOCUMENTS

JP     2000-011671     1/2000

OTHER PUBLICATIONS

International Search Report for PCT/GB2005/004636 mailed Sep. 8, 2006.
International Preliminary Report on Patentability in corresponding PCT Application PCT/GB2005/004636 dated Jun. 12, 2008.

\* cited by examiner

*Primary Examiner*—Tuan T Nguyen
*Assistant Examiner*—R Lance Reidlinger
(74) *Attorney, Agent, or Firm*—Nixon & Vanderhye P.C.

(57) ABSTRACT

A data processing system comprising a memory array having a plurality of memory cells and read circuitry for reading a logic value stored in one of the plurality of memory cells. The read circuitry is operable perform two substantially simultaneous reads of the stored logic value. A voltage controller is provided and is operable to selectively vary a level of a supply voltage to the memory array. Detection circuitry is provided for detecting, in dependence upon the two substantially simultaneous reads, when the supply voltage level causes the read result to be unreliable.

18 Claims, 7 Drawing Sheets

APPARATUS AND METHOD FOR ADJUSTING A SUPPLY VOLTAGE BASED ON A READ RESULT

Figure 1:
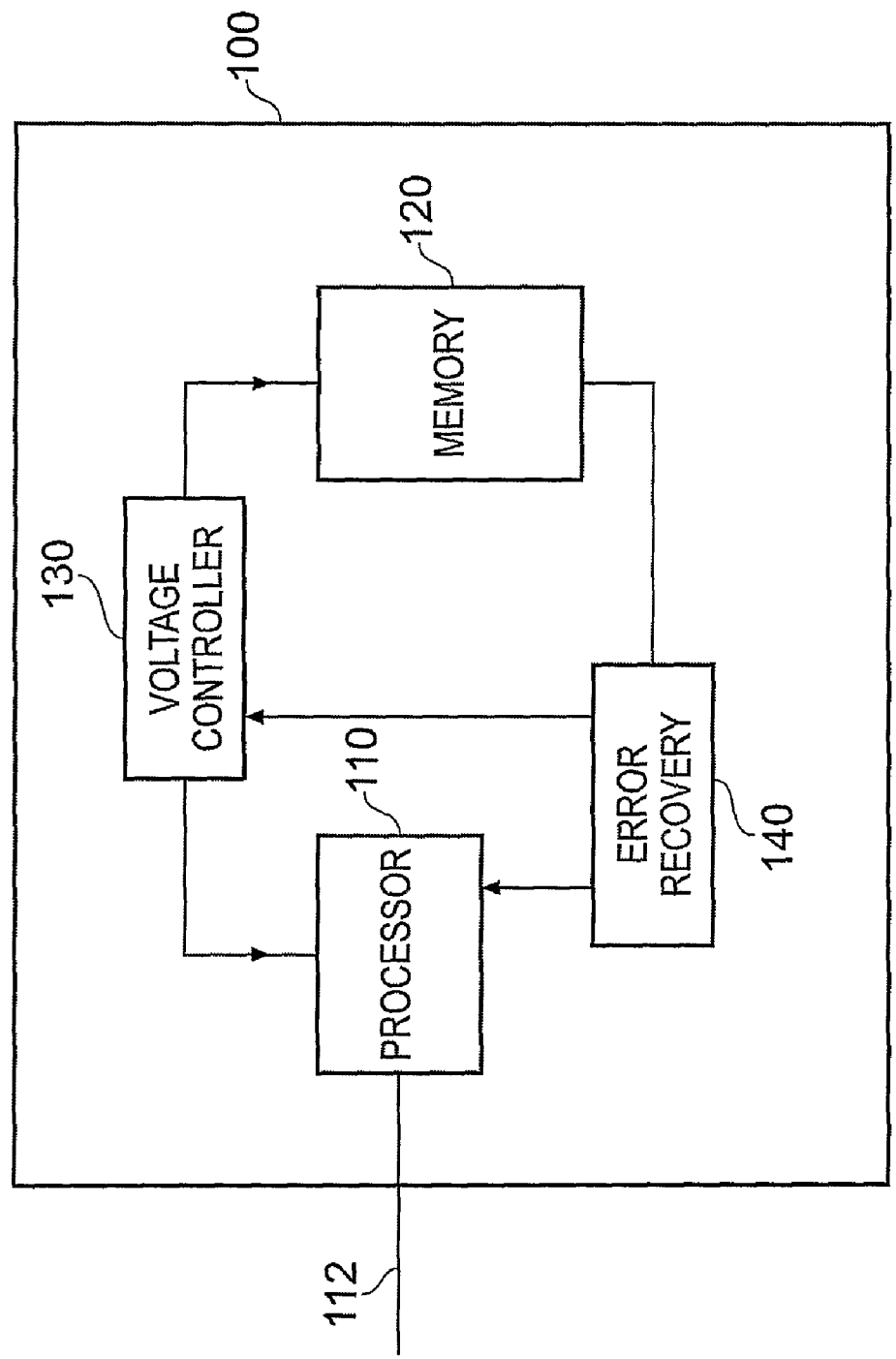

This application is the U.S. national phase of International Application No. PCT/GB2005/004636 filed 2 Dec. 2005 which designated the U.S., the entire contents of each of which are hereby incorporated by reference.

This technical field relates to data processing systems, and more particularly, to memory array read circuitry.

It is known to provide data processing systems having memory arrays that use a voltage difference detector to read a voltage differential from a pair of complementary bit lines. The voltage difference detector is typically a sense amp.

In known memory systems a pair of complementary bit lines is configurable to be selectively chargeable such that pulling down of a voltage of one of the pair of complementary bit lines corresponds to a logic value of one whereas pulling down a voltage of the other of the pair of complementary bit lines corresponds to a logic value of zero. The difference between the voltages on the bit line and the complementary bit line when a logic value is being read is typically in the region of 100 mV.

Some modern processors offer the functionality of being able to set the processor to one of a number of different processor performance levels at a given time, depending on the requirements of the program application. Such processors take the advantage of the fact that reducing the clock frequency and the corresponding operating voltage of the processor can potentially yield a quadratic decrease in energy consumption. However, processor performance reduction is only acceptable if there is little or no performance impact perceived by the user.

In a data processing system that allows for a number of different performance levels it may be possible to adjust a level of a supply voltage supplied to a memory array of the data processing system. However, when the operating voltage of the memory is reduced then the bit line differential may be reduced which can lead to failure of the voltage difference detectors that are used in the memory read circuitry. If the voltage differential is not sufficiently large to ensure correct operation of the voltage difference detector (e.g. sense amp) then memory read operations could produce false results. The fact that this has happened may not be known until the system fails. This is a particular problem in data processing systems that allow for a voltage scaling of the supply voltage level supplied to data processing system components such as the processor.

U.S. Pat. No. 6,944,067 entitled "Memory System having Fast and Slow Data Reading Mechanisms" assigned to ARM Limited and the University of Michigan discloses a memory comprising a fast data reading mechanism and a slow data reading mechanism. In the system disclosed therein a comparator detects if a fast read result from the fast data reading mechanism differs from a slow read result from the slow data reading mechanism and error detection logic suppresses further processing using the fast read result in the event that the comparator detects a difference.

Viewed from one aspect, an apparatus for processing data, is provided that comprises:
a memory array comprising a plurality of memory cells and read circuitry operable to perform at least two substantially simultaneous reads of a logic value stored in a selected one of said plurality of memory cells, said read circuitry being operable to output a read result for said stored logic value;
a voltage controller operable to selectively vary a level of a supply voltage supplied to said memory array;
detection circuitry for detecting, in dependence upon said at least two substantially simultaneous reads when said supply voltage level is causing said read result to be unreliable.

The technology described herein recognises that in a system in which it is possible to vary a level of a supply voltage supplied to a memory array, providing detection circuitry to detect when the supply voltage level is causing the read result to be unreliable prevents erroneous read results going undetected and therefore avoids system failure. The invention recognises that detection of an error can be performed in dependence upon at least two substantially simultaneous read results (i.e., read operations performed at substantially the same sampling time). Performing the plurality of read operations at substantially the same sampling time has the advantage that the error detection can be performed rapidly and efficiently before any erroneous result has been passed on to a subsequent stage of computation. For example, a comparison between the at least two read values can be efficiently performed since the at least two read values can be supplied to a comparator substantially simultaneously.

Performing at the at least two substantially simultaneous read operations reduces the impact of the check that determines whether the read result is reliable or not. For example, in the system of U.S. Pat. No. 6,944,067 described above, the delayed read of the slow data reading mechanism means that the bitlines will be left to fall for a longer period and to a lower value.

This gives less time for the bitlines to be re-charged to precharge voltage, and there will be a greater voltage to be charged. This will reduce the operating frequency if the read cycle timing governs the maximum frequency. Also power consumption will be higher as the bitlines are being discharged/charged through a higher voltage. By way of contrast, the simultaneous read operations according to the present invention enable the reliability of the read result to be checked with a lower power consumption penalty and with a reduced impact on the operating frequency.

In one embodiment the voltage controller is operable to vary the supply voltage level in dependence upon an output of the detection circuitry. This provides a direct link between detection of an unreliable read result and instigation of an error recovery operation that will resolve the problem. For example, the voltage controller can be triggered by an error recovery operation to increase the voltage supply level to the memory array to rectify any erroneous read results.

In one embodiment the data processing apparatus comprises error recovery circuitry for performing an error recovery operation in response to detection of an unreliable result by the detection circuitry. This enables an erroneous read result to be disregarded by the data processing system to prevent that erroneous result filtering through to and corrupting any ongoing calculation and thereby improving the reliability of the data processing results.

In one embodiment the error recovery operation comprises sending control information to the voltage controller to increase the supply voltage level. Increasing the supply voltage level increases the voltage differential supplied to the read circuitry of the memory array and thus reduces the likelihood of a further erroneous read result.

In one embodiment the read circuitry comprises a pair of complementary bit lines and a differential voltage detector operable to detect a voltage difference between the complementary bit lines and to output the read result.

It will be appreciated that the detection circuitry for detecting when the supply voltage level is causing the read result to be unreliable could be provided in the form of a built-in self test (BIST) system to check the memory array in the event of any change in the operating voltage. However, running BIST can be time consuming and does not take kind of transient environmental factors.

In one embodiment the detection circuitry comprises a supplementary differential voltage detector arranged in parallel with the differential voltage detector associated with the pair of complementary bit lines to detect the voltage difference. The supplementary differential voltage detector is operable to output a supplementary read result and any difference between the read result and the supplementary read result is used to indicate that the read result is potentially unreliable. Provision of the supplementary differential voltage detector produces a useful cross-check of a read result and is simple to implement. The arrangement whereby the supplementary voltage detector is arranged in parallel with the voltage detector allows a read result to be checked when it occurs without delay, which means that account can be taken of transient environmental factors such as noise or a power supply drop.

In one embodiment the detection circuitry comprises an exclusive OR logic gate. The output of the differential voltage detector and an output of the supplementary differential voltage detector are supplied as two inputs to the exclusive OR gate. Thus a simple test can be provided whereby the output of the exclusive OR logic gate is indicative of an erroneous read result since any difference in the value read by the differential voltage detector and the supplementary differential voltage detector is indicated by the output of the exclusive OR gate (a logical HIGH result signalling any discrepancy).

The differential voltage detector has a first built-in offset voltage and the supplementary differential voltage detector has a second built-in offset voltage. The first built-in offset voltage is different from the second built-in offset voltage. The different built-in offset voltages allow for a more reliable error detection since it is less likely that the supplementary differential voltage detector will simply replicate the result of the differential voltage detector when the built-in offset voltages differ. The different built-in offsets provide for the range of sensitivity of each of the differential voltage detectors to be appropriately adjusted to suit the desired detection criteria. A differential voltage detector has a characteristic switching point whereby it switches from indicating a logic value of zero to a logic value of one. Having different built-in offset voltages for the differential voltage detector and the supplementary differential voltage detector enables the respective switching points to be conveniently arranged such that there is a range of voltage differentials for which it will be likely that the differential voltage detector and the supplementary differential voltage detector will give opposite read values. This can be used to indicate that a very small voltage differential that is likely to result in an erroneous memory read operation is being produced on the complementary bit line pairs.

In one embodiment each of the first built-in offset voltage and the second built-in offset voltage is a non-zero offset voltage. In another embodiment the first built-in offset voltage is of equal magnitude and opposite plurality to the second built-in offset voltage. This allows for a convenient and well-defined voltage differential range in which an error in a read result can be reliably detected It is likely that the probability of error for reading a one or a zero is the same. Providing a system having equal and opposite built in-offsets is very efficient for this situation. If the built-in offsets were not equal then the circuit would have to have a greater bitline differential to overcome the larger offset.

In one embodiment the differential voltage detector has a first random offset voltage and the supplementary differential voltage detector has a second random offset voltage. A first sum comprising a sum of the first built-in offset voltage and the second built-in offset voltage has a value of at least a second sum comprising a sum of the first random offset voltage and the second random offset voltage. This takes account of the effects of the random offset in the differential voltage detector and the supplementary provided differential voltage detector when considering the error detection capability provided by the suitably-adjusted built-in offset voltages and reduces the likelihood that there will be a voltage differential range for which it is not possible to detect an error in a read operation.

In one embodiment at least one of the differential voltage detector and the supplementary differential voltage detector is a sense amplifier. In one particular embodiment of this type the sense amplifier comprises four transistors arranged to form two cross-coupled transistor pairs. In one such embodiment having two cross-coupled transistor pairs at least one of the first built-in offset and the second built-in offset is produced by increasing a transistor width of one of the four transistors of the two cross-coupled pairs relative to the transistor widths associated with the remaining ones of the four transistors such that in operation an imbalance is created in a rate of voltage pull-down internal to the sense amplifier. In an alternative embodiment comprising two cross-coupled pairs of transistors an imbalance is created in the rate of voltage pull-down internal to the sense amplifier by using a capacitance within the sense amplifier.

In one embodiment the array is an on-chip memory array and in an alternative embodiment the memory array is an off-chip memory array.

According to a second aspect, the apparatus for processing data comprises:
  a pair of conducting lines operable to signal a current logic state, said current logic state corresponding to either a first logic state or a second logic state;
  a first differential voltage detector operable to detect a first estimated value of said current logic state from a voltage difference between said pair of conducting lines, said first differential voltage detector having a first built-in voltage offset value for discriminating between said first logic state and said second logic state;
  a second differential voltage detector operable to detect a second estimated value of said current logic state from a voltage difference between said pair of conducting lines, said second differential voltage detector having a second built-in voltage offset value for discriminating between said first logic state and said second logic state, said second built-in offset voltage value being different from said first built-in offset voltage value; and
  error detection circuitry operable to detect an error in a detected value of said current logic state in dependence upon said first estimated value and said second estimated value of said current logic state.

According to a third aspect, a method of processing data comprises:
  performing at least two substantially simultaneous reads of a logic value stored in a selected one of a plurality of memory cells of a memory array and outputting a read result for said stored logic value;
  selectively varying a level of a supply voltage supplied to said memory array;

detecting, in dependence upon said at least two substantially simultaneous reads, when said supply voltage level is causing said read result to be unreliable.

Figure 2:
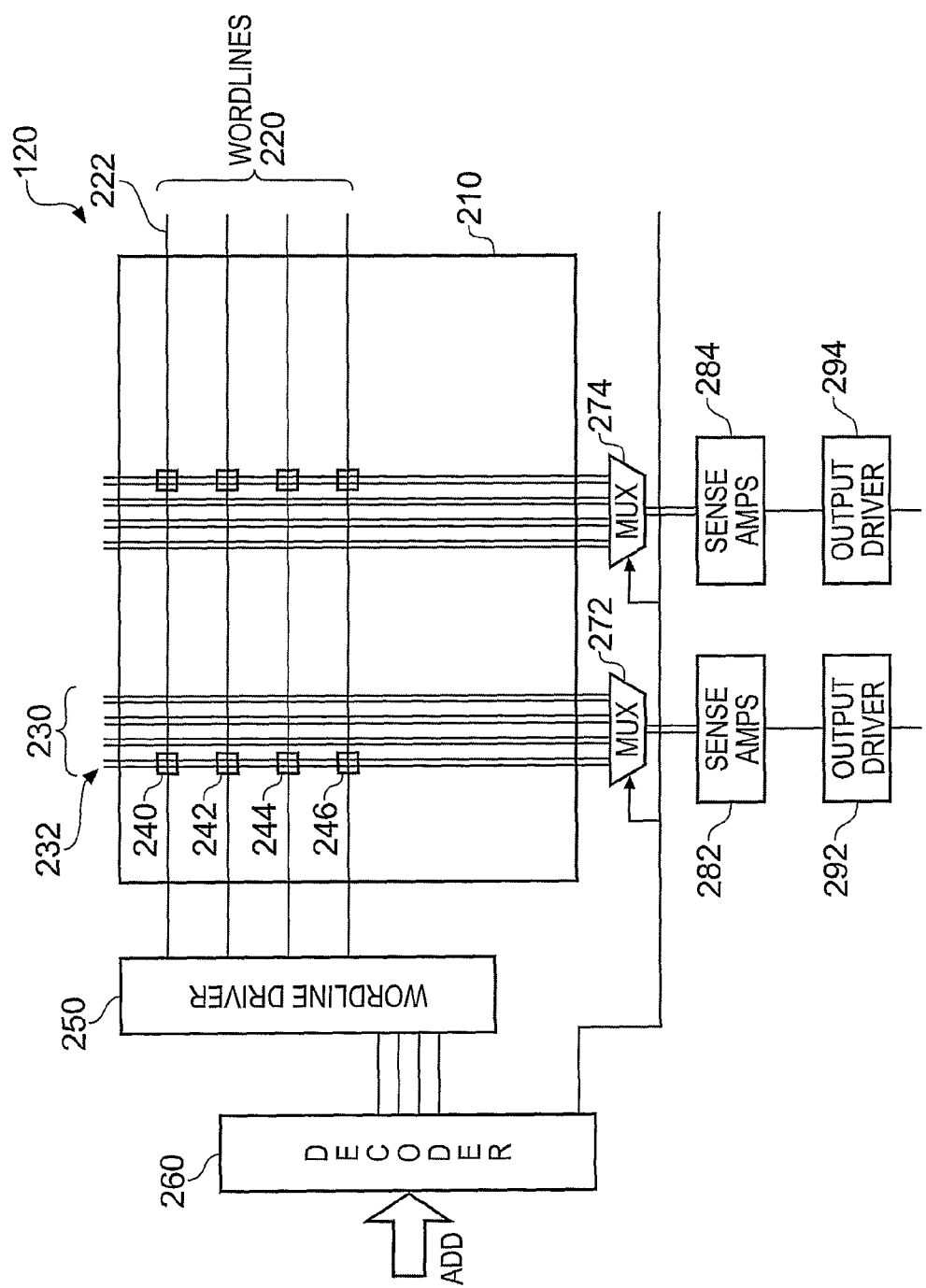
Figure 3:
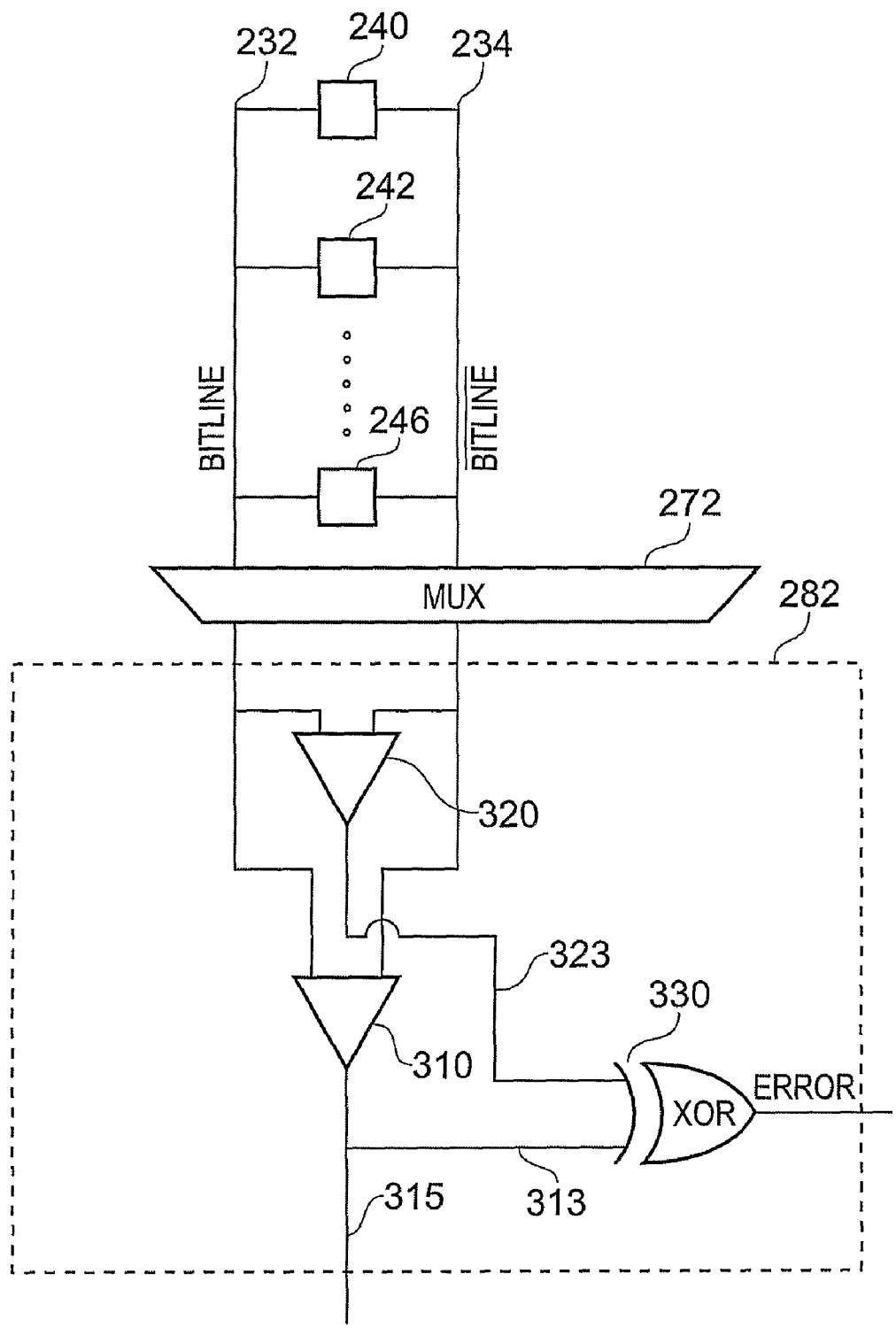
Figure 4A:
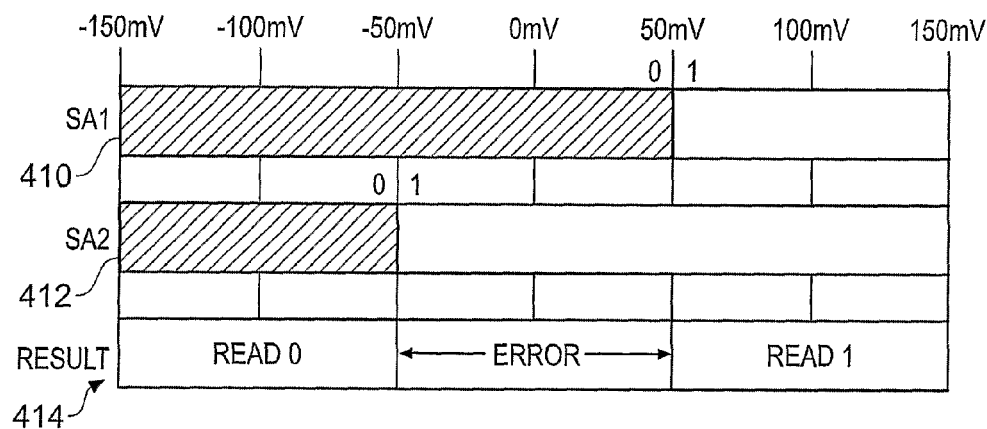
Figure 4B:
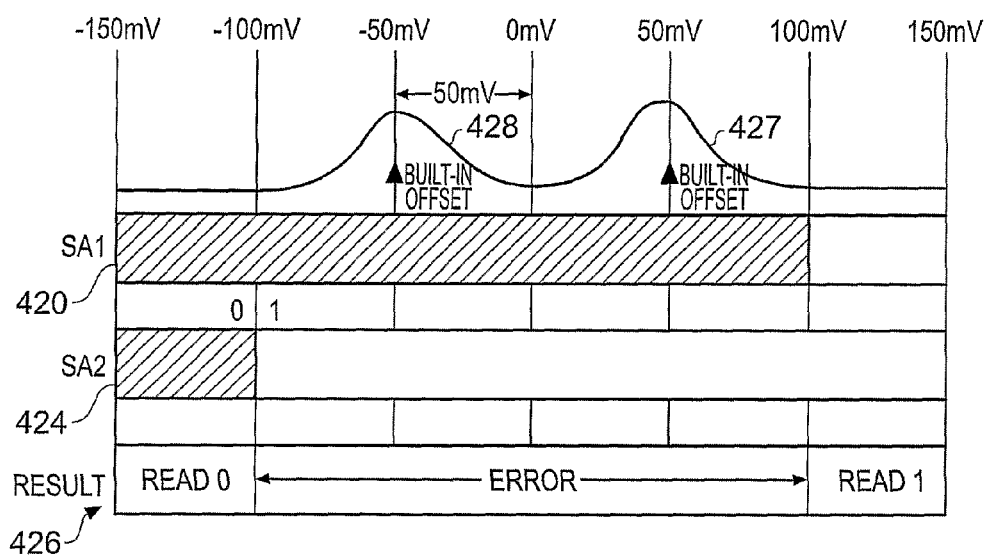
Figure 4C:
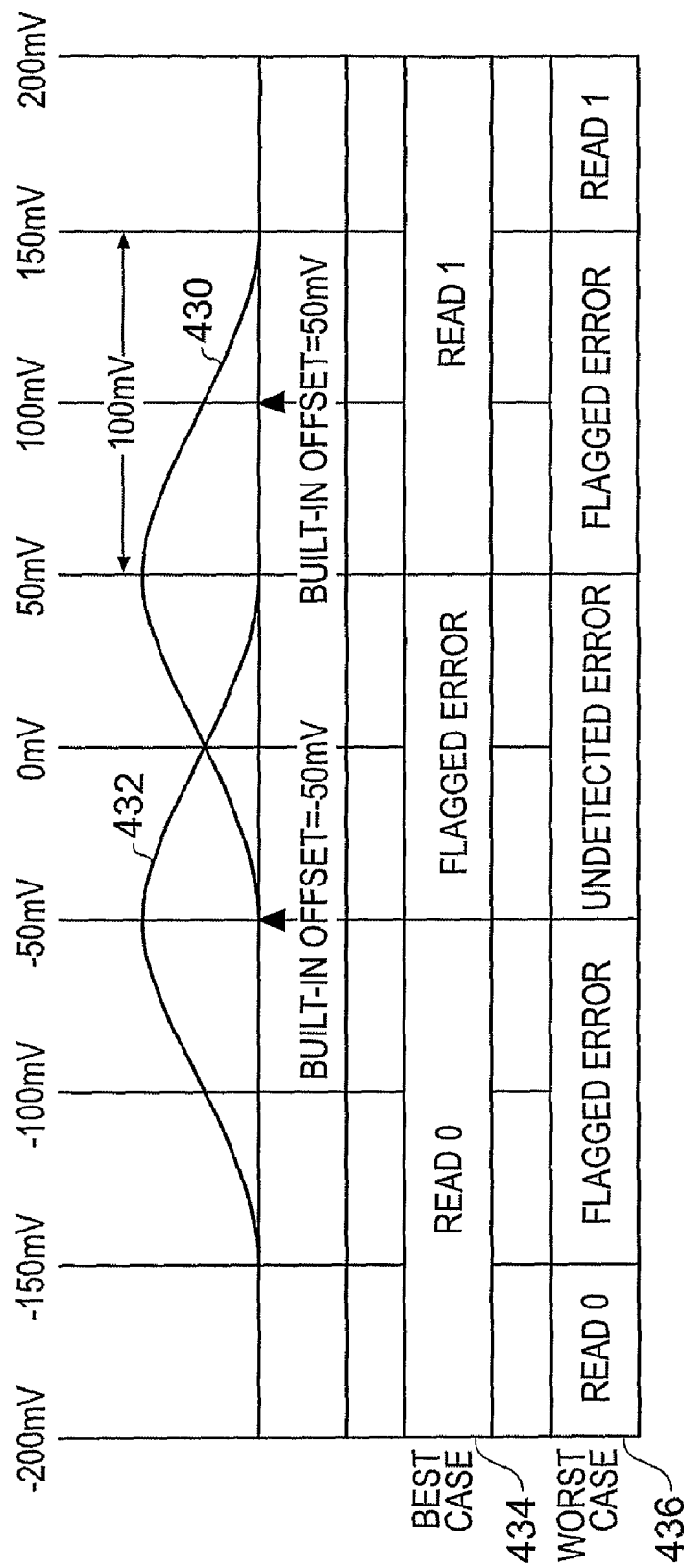
Figure 5:
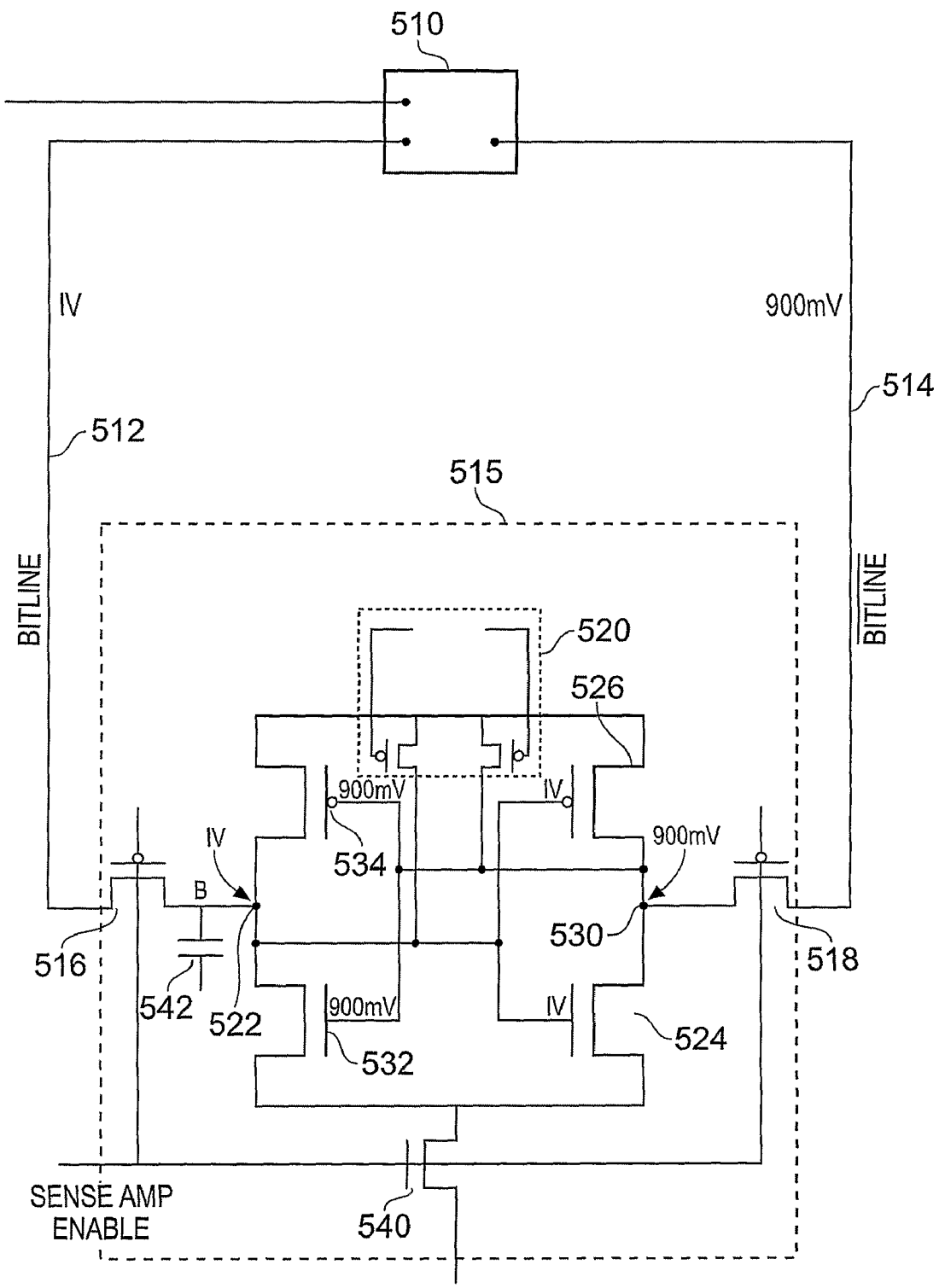
Figure 6:
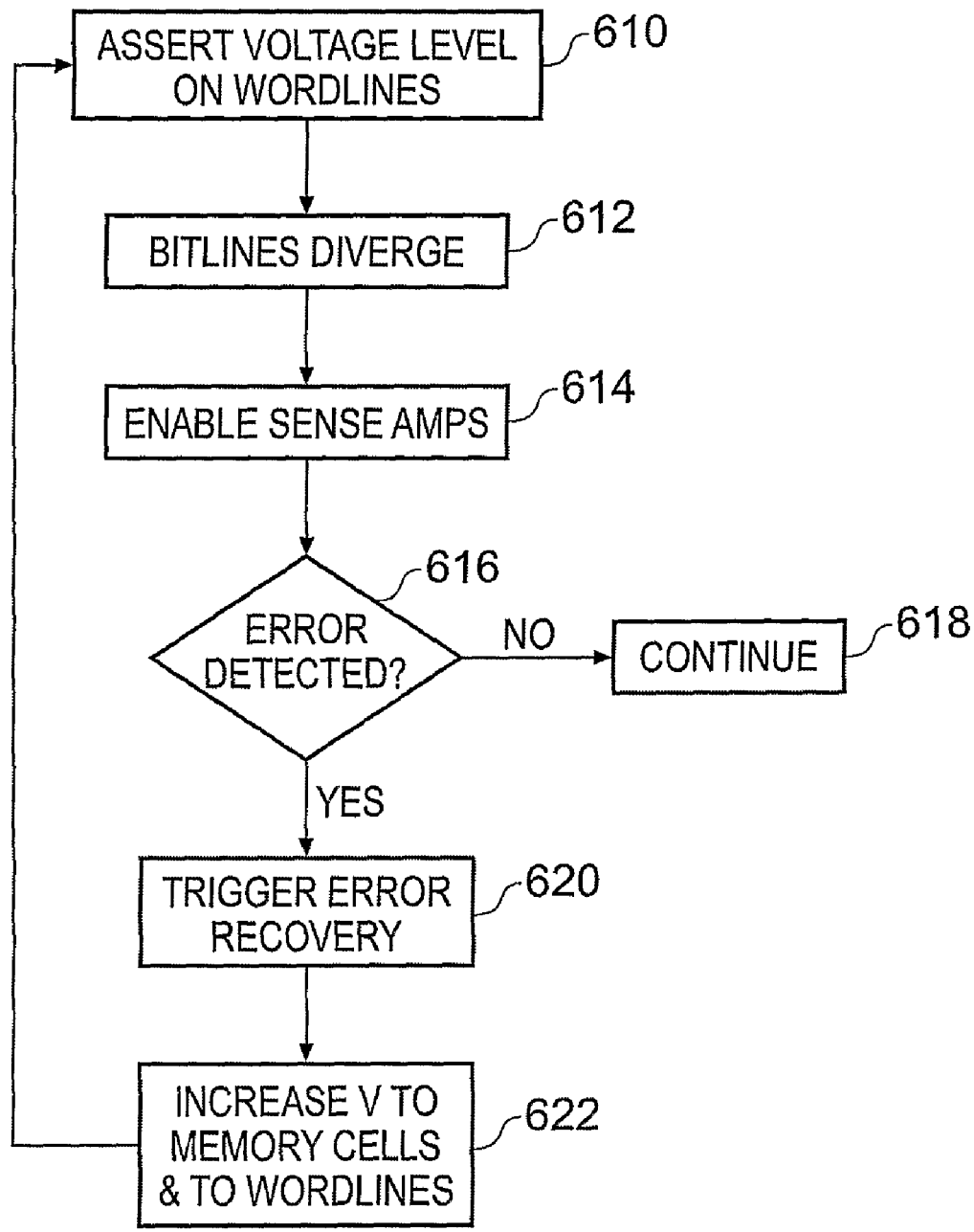

FIG. 1 schematically illustrates a data processing system in which a variable supply voltage can be supplied to a memory array;

FIG. 2 schematically illustrates a memory array and associated read circuitry;

FIG. 3 schematically illustrates a pair of complementary bit lines and sense amp circuitry operable to indicate the reliability of the read result;

FIGS. 4a, 4b and 4c schematically illustrate a range of voltage differential values between a pair of complementary bit lines for which an erroneous read result can be detected taking account of built-in offsets and random offsets associated with the voltage difference detectors;

FIG. 5 schematically illustrates a sense amp operable to output a read result from a memory cell;

FIG. 6 is a flowchart that schematically illustrates how detection of an error in a read result can be used to adjust a supply voltage level to the memory array of the data processing device of FIG. 1.

FIG. 1 schematically illustrates a data processing apparatus 100 comprising a processor 110; a memory 120; a voltage controller 130; and an error recovery module 140. A "long-line" 112 is arranged to supply a signal to the processor 110.

The processor 110 is operable to perform data processing operations on data values and the processor operates at a supply voltage and an operating frequency that is determined by the voltage controller 130. The voltage controller 130 is operable to selectively vary a supply voltage supplied to the processor 110 and also to selectively vary a supply voltage supplied to the memory 120 in dependence upon current operating requirements of the data processing apparatus 100. Thus the voltage controller can reduce the operating voltage and the operating frequency of the processor and the supply voltage of the memory to save power.

The voltage controller 130 can independently vary a supply voltage level supplied to memory cells within the memory 120 and a voltage supply level supplied to bit lines of memory cells within the memory 120. The error recovery module 140 is responsive to a detection within the memory 120 of the fact that a memory output value is to trigger an error recovery operation. Errors in read values of the memory output may occur as a direct result of a voltage supply level to the memory that is too low. The error recovery module 140 is operable to perform an error recovery operation that involves supplying information indicative of an error in the memory read operation to both the voltage controller 130 and to the processor 110. The voltage controller 130 is operable to increase the supply voltage level to the memory 120 in response to the control signals of the error recovery module 140 and the processor calculation 110 is operable to perform an error recovery operation on a data processing cancellation performed by the processor 110 in response to information from the error recovery module that an error in a memory read operation has occurred. The error recovery operation will typically involve re-starting any calculation likely to be corrupted by an erroneous memory read.

FIG. 2 schematically illustrates the structure of the memory 120 of FIG. 1 in more detail. The memory 120 comprises: an array of memory cells 210; a plurality of word lines 220 (supplying memory rows); a plurality of bit lines 230 (supplying memory columns); a word line driver 250; an address decoder 260; a series of muliplexers 272, 274; a plurality of sense amp circuits 282, 284; and a plurality of output drivers 292, 294.

In the memory array 210 a memory cell 240 is formed at an intersection of a word-line 222 with a bit line 232. A given word line 222 connects a row of memory cells 240 whereas the given bit line 232 connects a column of memory cells 240. The word lines 220 and bit lines 230 are conducting lines that can be activated by supplying a voltage to them. The word-line driver 250 selectively activates a given word-line 222 in order to perform a read operation from or a write operation to a given memory cell 240. The decoder 260 is responsive to an address supplied from the processor 110 to decode an address value to access an appropriate memory cell 240 of the memory array 210.

The bit lines 230 are arranged into groups of four bit lines and each group has an associated multiplexer 272, 274. The bit lines 230 are arranged in complementary pairs. Each of the multiplexers 272, 274 enables one of the four bit lines with which it is associated to be selected to output a read value from an associated memory cell 240. The address decoder 260 supplies an output that is provided to the multiplexers 272, 274 and thus the decoder 260 controls selection of an appropriate one of the bit lines by supplying a control input to one of the multiplexers 272, 274. The multiplexer 272 outputs the read value from one of the pairs of bit lines to the sense amp circuitry 282 which gives the value for a logic state associated with the stored value in the memory cell 240. The output of the sense amp circuit 282 is supplied to the respective output driver 292 for output to the processor 110. Similarly, the multiplexer 274 selectively reads the value from one of the four pairs of associated bit lines and supplies that value to the corresponding sense amp circuitry 284 and then to the respective output driver 294 for output to the processor 110.

Each pair of complementary bit lines is associated with a column of memory cells. In the quiescent state a pair of bit lines is initially pre-charged high. In order to perform a memory read operation the word line driver 250 activates a given word line 222 whereupon the word line goes to a high voltage and one of the two complementary bit lines associated with a memory cell that is to be read will be pulled down. Which one of the complementary bit lines is pulled down depends on the logic value that is currently stored in the memory cell. The voltage swing of a pulled down bit line is usually comparatively low i.e. in the region of 100 mV. The small voltage difference between the complementary bit line pairs is amplified by the sense amp circuitry 282, 284 and the sense amp circuitry makes a prediction of the currently stored logic value in dependence upon the amplified voltage difference.

The voltage controller 130 of FIG. 1 is operable to adjust to selectively adjust a supply voltage to the word lines 230 or a supply voltage to the individual memory cells 240, 242, 244, 246. The reliability of the value read from the memory cell by the sense amp circuitry 282, 284 will be dependent upon a sufficiently high supply voltage being supplied to the memory array 210. An insufficient supply voltage will result in the sense amp circuitry 282, 284 performing an unreliable determination of the logic value stored in an individual memory cell.

FIG. 3 schematically illustrates the sense amp circuitry module 282 in more detail together with an associated complementary bit line pair 232, 234. The plurality of memory cells 240, 242, 246 comprises a column of the memory array 210 and the memory cells are connected in parallel between the bit line 232 and the complementary bit line 234. As in FIG. 2, the multiplexer 272 selectively supplies the output of the bit line pairs to the sense amp circuitry module 282. At the base of the column a differential voltage detector 310 is also connected in parallel between the bit line 232 and the complementary bit line 234. In this particular arrangement the differential voltage detector 310 is a sense amplifier. In addition to the differential voltage detector 310 a supplementary differential voltage detector 320 is also connected in parallel between the bit line 232 and the complementary bit line 234. The differential voltage detector 310 the supplementary differential voltage detector 320 both perform reads of a logic value stored in one of the memory cells 240, 242, 246 at substantially simultaneous sampling times. The differential voltage detector 310 outputs a read result along the signal line 313 and the supplementary differential voltage detector 320 outputs a supplementary read result along the signal line 323. The signal line 313 and the signal line 323 are supplied substantially simultaneously as first and second inputs to an exclusive OR logical gate 330. The output of the differential sense amplifier 310 is supplied to the output driver 292 (see FIG. 2) via the signal line 315. Thus the exclusive OR gate 330 provides an output signal indicative of any error in the read operation. If the read result from the differential voltage detector 310 matches the supplementary read result from the supplementary differential voltage detector 320 then the exclusive OR gate 330 will output a LOW logic value indicating that the read result is reliable. However, if the supplementary read result output by the supplementary voltage difference detector 320 differs from the read result output by the differential voltage detector 310 then the output of the exclusive OR gate will be a logical HIGH and this indicates that the read result is unreliable. This is likely to occur if the supply voltage value supplied to word-lines 220 and bit-lines 230 of the memory array is insufficient to ensure reliable operation of the read circuitry of the memory array 210. The error results output by the exclusive OR gate 330 are supplied to the error recovery circuit 140 of FIG. 1 to ensure that the inadequate supply voltage to the memory array 210 can be remedied by the voltage controller 130. The error recovery circuit 140 of FIG. 1 also ensures that the processor 110 does not make use of any erroneous data value output by the memory array 210.

In the arrangement of FIG. 3, the differential voltage detector 310 and the supplementary differential voltage detector 320 are configured to perform at two substantially simultaneous reads of a logic value stored in one of the memory cells 240, 242, 246. However, it will be appreciated that in alternative arrangements more than one supplementary differential voltage detector could be provided to enable more than two substantially simultaneous read operations to be performed. The characteristics of each of the plurality of differential voltage detectors can be suitably adjusted to facilitate reliable error detection of the read result.

FIGS. 4A, 4B and 4C schematically illustrates the responses of the differential voltage detector 310 and then supplementary voltage difference detector 320 of FIG. 3 to different values of the voltage differential across the complementary bit line pair 232, 234.

Note that an idealised voltage difference detector is considered to have no "built-in offset voltage" and no random offset voltage and would be expected to read a first logic state for any voltage differential greater than zero and a second different logic state (e.g. data value 0) for a voltage differential less than zero. FIG. 4A schematically illustrates the characteristics of the voltage difference detector 310 and the supplementary voltage difference detector 220 according to the present technique in which each of the voltage difference detectors 310, 320 has a non-zero built-in offset voltage. In this case the voltage difference detector 310 has a built-in voltage offset of 50 mV whereas the supplementary voltage difference detector 320 has a built-in voltage offset of −50 mV. FIG. 4A shows a range of voltage differentials from −150 mV through to +150 mV. The bar graph 410 shows the voltage response of the voltage difference detector 310 to the range of voltage differentials. Since the built-in offset voltage of this voltage difference detector is equal to 50 mV it can be seen that for voltage differentials in the illustrated range of −150 mV (also for the range below −150 mV although not plotted in FIG. 4A) up to an including 50 mV the read value of the logic state corresponds to a zero whereas for voltage differentials of 50 mV through to 150 mV (also for the range above 150 mV although not shown in FIG. 4A) the logic state read by the differential voltage detector 310 is a logic value of one.

The bar graph 412 shows the voltage response characteristics of the supplementary voltage detector 320 and in this case the detector outputs a logic state of zero for voltage differential values in the range of −150 mV through to −50 mV whereas for values of above −50 mV the supplementary differential voltage detector 320 outputs a logic value of one. This is because the built-in offset voltage of the supplementary voltage difference detector 320 in this case is −50 mV.

The bar chart 414 shows the overall result of the memory read operation based on two substantially simultaneous reads of the logic value using the differential voltage detector the supplementary differential voltage detector 320. The associated reliability of the overall result is also shown. In particular, it can be seen that there is a region that spans −50 mV through to 50 mV in the result bar chart 414 that corresponds to the read logic state of the voltage difference detector 310 outputting a value of zero and the supplementary voltage difference detector 320 outputting a value of one for the same voltage differential. This range of voltage differential values corresponds to an unreliable operational voltage range of the sense amplifier circuit 232 and results in an error being flagged by the exclusive OR logic gate 330 (see FIG. 3). For the voltage differential range from −150 mV through to −50 mV the voltage difference detector 310 reliably outputs a read-value of logic state zero whereas for the voltage differential range from 50 mV through to 150 mV and beyond the voltage difference detector 310 reliably outputs a logic state read value of one. It can be seen that these reliable voltage differential parameter ranges correspond to a coincidence in read values output by the voltage difference detector 310 and the supplementary voltage difference detector 320. The voltage characteristics illustrated by the bar charts of FIG. 4A represent an idealised version of voltage difference detectors that do not take into account an inherent random offset voltage that is typically associated with the voltage difference detector 310 and the supplementary differential voltage detector 320.

FIG. 4B schematically illustrates the response characteristics to a range of bit-line voltage differentials of the voltage difference detector 310 and the supplementary voltage difference detector 320 that (unlike the response characteristics of FIG. 4A) takes account of the random voltage offset. Note that the graph of FIG. 4B is a worst-case condition. As was the case in FIG. 4A, the voltage difference detector 310 and the supplementary voltage difference detector 320 have built-in offset values of 50 mV and −50 mV respectively and are configured to perform read operations at substantially the same sampling time. The bar chart 420 shows the response of the voltage difference detector 310 to a range of voltage differentials and the bar chart 424 shows the corresponding response of the supplementary voltage difference detector 320 to the same range of voltage differentials. In each case the random voltage offset as well as the built-in offset is taken into account.

At the top of FIG. 4B a graph is shown that plots the probability of the switching threshold being at a given differential input, against the voltage differential on the bit-line pair. The random offset of the differential voltage detector 310 corresponds to Gaussian error curve 427 having a mean value centred at 50 mV whereas the random voltage offset associated with the supplementary differential voltage detector 320 has a Gaussian probability error curve 428 having a mean centred on −50 mV. As before, the differential voltage detector 310 and the supplementary differential voltage detector 320 are configured to output read results substantially simultaneously (i.e. at the same sampling time). The random offsets of the two different voltage detectors 310, 320 are not necessarily identical in profile and typically depend upon random effects within the voltage difference detector circuitry but can also be effected by external factors. It will be appreciated that operation of the differential voltage detectors is only reliable in the tails of the Gaussian curve and not in the peak regions where the probability of an unreliable result is high. It can be seen by comparing the bar chart 420 with the corresponding bar chart 410 that the effects of the random offset on the differential voltage detector 310 are such that the switching point between a logic output value of zero and a logic output value which occurs at a value of one of 50 mV in FIG. 4A changes to a worst case switching point of 100 mV in the bar chart 420 despite the fact that the built-in offset of the differential voltage detector 310 is set to be 50 mV in both FIG. 4A and FIG. 4B.

The effects of the random voltage offset associated the supplementary voltage difference detector 320 can be seen in the bar chart 424. In this case the switching point between outputting a logic value of zero and outputting a logic value of one shifts from the value of −50 mV in the corresponding bar chart 412 of FIG. 4A to the value of −100 mV in the bar chart 424 of FIG. 4B. From the bar chart 426 of FIG. 4B it can be seen that the net result of overlaying the effect of the random offset values on the built-in offset values of 50 mV and −50 mV for the differential voltage detector 310 and the supplementary differential voltage detector 320 respectively are such that the range of voltage differentials in which an erroneous read value can be expected is extended from the range between −50 mV and −50 mV in FIG. 4A (see bar chart 414) to a range of −100 mV through to 100 mV of FIG. 4B (see bar chart 426). In the arrangement illustrated in FIG. 4B it can be seen that the peak of the Gaussian probability curve 427, 428 coincides with the built-in voltage offset of the associated voltage difference detector 310, 320. In this case it can be seen that there is no significant overlap between the peak of the Gaussian curve 427 corresponding to the voltage difference detector 310 and the peak of the Gaussian probability curve 428 corresponding to the supplementary voltage difference detector 320. This has consequence that there is unlikely to be a voltage differential range (within the plotted range of −150 mV to 150 mV) for which an unreliable read value will go undetected.

FIG. 4C schematically illustrates a voltage response of the differential voltage 310 and the supplementary differential voltage detector 320 in a case where the Gaussian probability curves associated with the random offset of the voltage detectors 310, 320 span a broader voltage range than the peaks of the two Gaussian probability curves 427, 428 of FIG. 4C. It can be seen that in the case of FIG. 4C the peak to tail width of the Gaussian curves spans around 100 mV whereas in the case of FIG. 4B the peak to tail width of each of the Gaussian curves is about 50 mV. In the case of FIG. 4B there is a significant region in the range between −50 mV and 50 mV in which the probability of error in the read result is low i.e. there is a significant trough between the two peaks. This can be compared with the Gaussian profile of FIG. 4C where in the region between −50 mV and 50 mV although the probability of error for each of the curves 432 and 430 declines towards the centre of the graph approaching the zero mV mark there is still a significant probability of an erroneous read result for both of the two curves 430, 432. The result of this large overlap is that an error cannot be reliably detected for bit-line voltage differentials corresponding to this overlap region. The bar chart 434 shows the typical (or nominal average) case for the Gaussian error profiles shown 430, 432, in which the random offset has a large span and the built-in offsets are 50 mV for curve 430 and −50 mV for curve 432. The typical case corresponds to the case where there is no random offset and accordingly a logic value of zero will be read for all voltage differentials of less than −50 mV whereas the logic value of one will be read for all voltage differentials of greater than 50 mV. This is the same as the case in FIG. 4A, bar chart 414

In the case where the overlap of the random offsets do not in fact effect the read results in the region spanning −50 mV to 50 mV then the differential voltage detector 320 associated with the random offset curve 432 will almost certainly output a logic value of one whereas the voltage difference detector associated with the random offset curve 430 is still likely to give a voltage reading corresponding to a logic level of zero so that the difference in the read values will result in an error being flagged by the exclusive OR gate 330. Similarly, in the voltage region spanning −50 mV down to −150 mV, the voltage difference detector 310 associated with the random offset curve 430 will almost certainly output a logic value of zero whereas the voltage difference detector associated with the random offset curve 432 is still highly likely to output a logic level of one so that the difference in the substantially simultaneous read values will result in an error being flagged. However, in the region spanning −50 mV through to 50 mV the probability of error in output for each of the differential voltage detectors associated with random offset curves 430 and 432 respectively is high. It follows that the difference in the read values cannot be relied upon to detect an error. In order to reduce the likelihood of having a large range of differential voltages for which an error cannot be detected, it can be arranged that the sum of the built-in offset voltages associated respectively with the differential voltage detector 310 and the supplementary differential voltage detector 320 is at least as large as the sum of the random offset voltages associated with these differential voltage detectors. This has the effect that there is not a significant overlap in the random offset curves which avoids the situation illustrated in FIG. 4C, bar chart 436 in which there is a large region for which an error cannot be reliably detected.

However, the behaviour of the circuit as described in FIG. 4C may be acceptable in some cases, for example if the "undetected error" region is impossible to get to in normal circuit operation then having this region is acceptable.

FIG. 5 schematically illustrates a memory cell and an associated read circuit comprising a sense amp. The arrangement comprises a memory cell 510 which is connected to a bit-line 512 and a complementary bit line 514. Read circuitry 515 is connected between the bit line 512 and the complementary bit line 514. Note that a multiplexer will typically be provided to selectively connect the memory cell 510 to the read circuitry 515 (as in FIG. 2), but this is not shown in FIG. 5. The read circuitry 515 comprises a sense amp. The sense amp comprises a pair of isolation PMOS transistors 516, 518 which serve to isolate the sense amp from the bit line 512 and the complementary bit line 518 when a read operation is being performed. The sense amp also comprises two pairs of cross-coupled transistors. A first pair of transistors comprises an NMOS transistor 524 and a PMOS transistor 526. A second pair of transistors comprises a further NMOS transistor 532 and a further PMOS transistor 534. The two pairs of cross-coupled transistors 524, 526, 532, 534 are arranged between a first node 522 adjacent to the isolation PMOS transistor 516 and a second node 530 adjacent to the isolation PMOS transistor 580. The cross-coupling of the two transistor pairs is such that the gates of the transistor pair 524, 526 are connected to the first node 522 whereas the gates of the transistor pair 532, 534 are connected to the second node 530. The sense amp circuitry also comprises pre-charge select circuitry 520 that includes two PMOS transistors and also a pull down NMOS transistor 540 that is situated between the two NMOS transistors 524, 532 of the cross-coupled transistor pairs. The read circuitry 515 is responsive to a sense amp enable input to read a logic value from the bit line 512 and the complementary bit line 514.

A logic value of one is indicated by pulling down the voltage of the complementary bit line 514. The magnitude of the pull-down voltage is typically in the region of 100 mV such that for example in the illustrated arrangement a logical value of one will be indicated by retaining the bit line 512 at one volt whilst pulling the complementary bit line 514 down to 900 mV.

When the signal on the pair of bit sign 512, 514 indicates a logical one then the node 522 of the sense amp will be at one volt whereas the node 530 will be at 900 mV. Since the transistor pair 524 and 526 have their gates connected to the node 522, the NMOS transistor 524 will be switched on whereas the PMOS transistor 526 will be switched off. The transistor pair 532, 534 have their gates connected to the node 530 which is at 900 mV so the PMOS transistor 534 will still be off (assuming threshold voltage >100 mV), and 532 will be on, but not as strongly as 524. Since NMOS transistor 530 is switched on more strongly, the path through transistor 524 and 540 provides more current than the path through 532 and 540. This means node 530 will be pulled down towards Vss faster than 522. At some point node 530 will fall below the threshold voltage of PMOS transistor 534 so node 522 will fall even slower. Eventually the current through PMOS transistor 534 will be more than the current through 532 and node 522 will rise to $V_{dd}$ and node 530 would have fallen to Vss. The isolation PMOS transistors 516, 518 serve to isolate the cross-coupled transistor pairs from the bit line pair 512, 514

Now consider the states of the transistors of the read circuitry 515 when the pair of bit lines 512, 514 signal a logical zero instead of a logical one. In this case the bit line 512 is pulled down to 900 mV whereas the complementary bit line 514 is held at one volt. This means that the second node 530 is at 1V whereas the first node 522 is at 900 mV. The transistor pair 524, 526 have their gates connected to node 522, which is at 900 mV, so the PMOS transistor 526 will be off (assuming threshold voltage >100 mV) and NMOS transistor 524 will be on, but not as strongly as NMOS transistor 532. Since the NMOS transistor 532 is on more strongly, the path through transistors 532 and 540 provides more current than the path through 524 and 540. This means that node 522 will be pulled down towards Vss faster than node 530. At some point the node 522 will fall below the threshold of PMOS 526 so node 530 will fall even slower. Eventually, the current through the PMOS transistor 526 will be greater than the current through NMOS 524 and node 530 will rise to Vdd and node 522 will have fallen to Vss.

Each of the four transistors 524, 526, 532, 534 has a characteristic "width" and the greater the transistor width, the greater the current drive capability. A larger width transistor represents less resistance in a resistive model of the transistor. A sense amp having a zero built-in offset will be symmetrical about a vertical plane such that the characteristic widths of the transistor pair 524, 526 balance the characteristic widths of the transistor pair 532, 534. In order to create a non-zero built-in offset according to the present technique, a width of the NMOS transistor 524 in FIG. 5 is adjusted such that it is greater than the width required for a fully-balanced cross-coupled transistor pair. By increasing the width of the NMOS transistor 524 an imbalance is created in the speed of the voltage pull-down internal to the sense amplifier. Thus if the differential input to the sense amp is zero the node 522 or 530 that is pulled down faster will eventually be pulled to zero because of the regenerative action of the cross-coupled transistors. The opposite side will go to $V_{dd}$. In order to obtain the opposite value from the sense amplifier a certain amount of differential voltage will be needed on the input nodes 522, 530. The minimum voltage needed to overcome this is the built-in offset of the sense amplifier. In an alternative arrangement, rather than increasing the width of the NMOS transistor 524 relative to the other transistors of the cross coupled transistor pairs, a capacitance 542 can be added between node 522 and ground.

As explained above with reference to FIG. 5, the differential voltage detector 310 and the supplementary differential voltage detector 320 are configured such that they have different built-in offsets, which improves the reliability of an error result based on a comparison of two substantially simultaneous read values output respectively by the differential voltage detector 310 and the supplementary differential voltage detector 320. The two differential voltage detectors 310, 320 perform their read operations at substantially the same sampling time, but the construction parameters of the sense amplifiers such as transistor size, doping levels, gain etc. can be suitably adjusted to closely match the speed of operation of the supplementary differential voltage detector 320 with the speed of operation of the differential voltage detector 320 such that the two read values supplied to the exclusive OR gate 330 correspond to substantially simultaneous read values.

FIG. 6 schematically illustrates how the data processing apparatus of FIG. 1 responds to detection of an error by the sense amp circuitry 282 of FIG. 3. The process begins at stage 610 where a voltage level is asserted on the word lines (i.e. rows) of the memory array 210 of FIG. 2. Next at stage 612 the bit lines of a complementary bit line pair such as the pair 232, 234 illustrated in FIG. 3 diverge indicating the logic value stored in the memory cell. A logic value of one will be indicated by the complementary bit line 234 being pulled down in voltage whereas a logic value of zero will be indicated by the bit line 232 being pulled down in voltage. Next at stage 614 the sense amps are enabled via the sense amp enable signal (see FIG. 5). At this stage it is determined using the differential voltage detector 310 and the supplementary differential voltage detector 320 whether or not an error in the read value has been detected. An error is indicated if the two voltage difference detectors 310, 320 output different read values, which in turn results the exclusive OR gate 330 indicating an error. If no error is detected then the process continues and the voltage supplied to memory 120 and the processor 110 of the voltages supplied to the data processor of FIG. 1 are maintained at their current levels.

On the other hand, if an error is in fact detected at stage 616 then the process proceeds to stage 620 where an error recovery operation is triggered and implemented by the error recovery module 140 of FIG. 1. An erroneous read value cannot be tolerated since it could corrupt data processing operations. To prevent this, the error recovery module 140 is operable at stage 622 to send a control signal to the voltage controller 130 of FIG. 1 that results in the voltage supplied to the memory cells of the memory 120 and to the word lines 220 (see FIG. 2) being increased. An increase in the voltage supplied to the memory array 120 reduces the likelihood of errors in output of the read circuitry of the memory array. Following the increase in the voltage supplied to the memory array at stage 622 the process returns to stage 610 where the voltage level is asserted on the word line and a further read operation is performed. Thus, if the increase in voltage supplied to the memory is insufficient to resolve the erroneous operation a further increase in voltage will result.

The invention claimed is:

1. An apparatus for processing data, comprising:
a memory array comprising a plurality of memory cells and read circuitry configured to perform at least two substantially simultaneous reads of a logic value stored in a selected one of said plurality of memory cells, said read circuitry being configured to output a read result for said stored logic value;
a voltage controller configured to selectively vary a level of a supply voltage supplied to said memory array;
detection circuitry configured to detect, in dependence upon said at least two substantially simultaneous reads, when said supply voltage level is causing said read result to be unreliable,
wherein said voltage controller is configured to vary said supply voltage level in dependence upon an output of said detection circuitry.

2. The apparatus according to claim 1, comprising error recovery circuitry configured to perform an error recovery operation in response to a detection of an unreliable result by said detection circuitry.

3. The apparatus according to claim 2, wherein said error recovery operation comprises sending control information to said voltage controller to increase said supply voltage level.

4. The apparatus according to claim 1, wherein said read circuitry comprises a pair of complementary bit lines and a differential voltage detector configured to detect a voltage difference between said complementary bit lines and outputting said read result.

5. The apparatus according to claim 4, wherein said detection circuitry comprises a supplementary differential voltage detector arranged in parallel with said differential voltage detector to detect said voltage difference and wherein said supplementary differential voltage detector outputs a supplementary read result and wherein a difference between said read result and said supplementary read result indicates that said read result is unreliable.

6. The apparatus according to claim 5, wherein said detection circuitry comprises an exclusive OR logic gate and wherein an output of said differential voltage detector and an output of said supplementary differential voltage detector are inputs to said exclusive OR logic gate.

7. The apparatus according to claim 5, wherein said differential voltage detector has a first built-in offset voltage and said supplementary differential voltage detector has a second built-in offset voltage and wherein said first built-in offset voltage is different from said second built-in offset voltage.

8. The apparatus according to claim 7, wherein each of said first built-in offset voltage and said second built-in offset voltage is a non-zero offset voltage.

9. The apparatus according to claim 8, wherein said first built-in offset voltage is of equal magnitude and opposite polarity to said second built-in offset voltage.

10. The apparatus according to claim 5, wherein said differential voltage detector has a first random offset voltage and said supplementary differential voltage detector has a second random offset voltage and wherein a first sum comprising a sum of said first built-in offset voltage and said second built-in offset voltage has a value of at least a second sum comprising a sum of said first random offset voltage and said second random offset voltage.

11. The apparatus according to claim 5, wherein at least one of said differential voltage detector and said supplementary differential voltage detector is a sense amplifier.

12. The apparatus according to claim 11, wherein said sense amplifier comprises four transistors arranged to form two cross-coupled transistor pairs and associated enable and precharge transistors.

13. The apparatus according to claim 12, wherein at least one of said first built-in offset and said second built-in offset is produced by increasing a transistor width of one of said four transistors relative to transistor widths associated with remaining ones of said four transistors such that in operation an imbalance is created in a rate of voltage pull-down internal to said sense amplifier.

14. The apparatus according to claim 12, wherein at least one of said first built-in offset and said second built-in offset is produced by using a capacitance within said sense amplifier such that in operation an imbalance is created in a rate of voltage pull-down internal to said sense amplifier.

15. The apparatus according to claim 1, wherein said memory array is one of an on-chip memory array or an off-chip memory array.

16. An apparatus for processing data, said apparatus comprising:
a pair of conducting lines configured to signal a current logic state, said current logic state corresponding to either a first logic state or a second logic state;
a first differential voltage detector configured to detect a first estimated value of said current logic state from a voltage difference between said pair of conducting lines, said first differential voltage detector having a first built-in voltage offset value for discriminating between said first logic state and said second logic state;
a second differential voltage detector configured to detect a second estimated value of said current logic state from a voltage difference between said pair of conducting lines, said second differential voltage detector having a second built-in voltage offset value for discriminating between said first logic state and said second logic state, said second built-in offset voltage value being different from said first built-in offset voltage value; and
error detection circuitry configured to detect an error in a detected value of said current logic state in dependence upon said first estimated value and said second estimated value of said current logic state;
wherein said error detection circuitry is configured to detect an error when said first estimated value of said current logic state is different than said second estimated value of said current logic state;
wherein said first differential voltage detector has a first random offset voltage and said second differential voltage detector has a second random offset voltage, and wherein a first sum comprising a sum of said first built-in offset voltage and said second built-in offset voltage has a value of at least a second sum comprising a sum of said first random offset voltage and said second random offset voltage.

17. A method of processing data, comprising:
performing at least two substantially simultaneous reads of a logic value stored in a selected one of a plurality of memory cells of a memory array and outputting a read result for said stored logic value;
selectively varying a level of a supply voltage supplied to said memory array;
detecting, in dependence upon said at least two substantially simultaneous reads, when said supply voltage level is causing said read result to be unreliable; and
varying said supply voltage level in dependence upon an output of said detecting.

18. An apparatus for processing data, comprising:
a plurality of memory cells;
means for reading to perform at least two substantially simultaneous reads of a logic value stored in a selected one of said plurality of memory cells and for outputting a read result for said stored logic value;
means for controlling voltage to selectively vary a level of a supply voltage supplied to said plurality of memory cells; and
means for detecting, in dependence upon said at least two substantially simultaneous reads, when said supply voltage level is causing said read result to be unreliable;
wherein said means for controlling voltage is configured to vary said supply voltage level in dependence upon an output of said means for detecting.

* * * * *